United States Patent [19]
Fujisawa

[11] Patent Number: 5,402,384
[45] Date of Patent: Mar. 28, 1995

[54] DYNAMIC RAM

[75] Inventor: Kenzo Fujisawa, Hanno, Japan

[73] Assignee: Citizen Watch Co., Ltd., Tokyo, Japan

[21] Appl. No.: 167,929

[22] PCT Filed: Apr. 23, 1992

[86] PCT No.: PCT/JP93/00529
§ 371 Date: Dec. 21, 1993
§ 102(e) Date: Dec. 21, 1993

[87] PCT Pub. No.: WO93/22769
PCT Pub. Date: Nov. 11, 1993

[30] Foreign Application Priority Data
Apr. 24, 1992 [JP] Japan .................... 4-131598

[51] Int. Cl.6 ............................. G11C 13/00
[52] U.S. Cl. .................... 365/222; 365/189.01; 365/227

[58] Field of Search .......... 365/222, 189.01, 230.01, 365/227

[56] References Cited
U.S. PATENT DOCUMENTS
5,021,951 6/1991 Baba .................... 365/222

Primary Examiner—Terrell W. Fears
Attorney, Agent, or Firm—Rogers, Howell & Haferkamp

[57] ABSTRACT

A refresh switching circuit for a dynamic RAM which is capable of easily switching a RAS-only refresh to a CAS-before-RAS refresh, thereby consuming less electric power, easily executing a shift to a self-refresh (suspending), and obtaining compatability with conventional personal computer systems. The dynamic RAM comprises a CPU (101), dynamic RAM arrays (115) and a system logic (110) for use in a microprocessor system, and further comprises a refresh switching circuit (111) for switching the RAS-only refresh to the CAS-before-RAS refresh.

20 Claims, 6 Drawing Sheets

DYNAMIC RAM

Technical Field of the Invention

The present invention relates to a refresh switching circuit for a dynamic RAM (Random Access Memory) such as that commonly used as the memory device for a personal computer.

BACKGROUND OF THE INVENTION

A main memory device in a personal computer includes for general use thereof a dynamic RAM which is advantageous in view of the unit cost thereof in a memory capacity. Memory capacities of semiconductors are increased with the technical progress thereof, thereby reducing the size of personal computers.

A dynamic RAM is needed to be routinely refreshed for holding any data stored therein.

Conventional personal computers employ a RAS (Row Address Strobe)-only refresh procedure as a most standard technique wherein a CAS (Column Address Strobe) signal is set to a high level and a RAS signal is varied in conformity with refresh addresses applied to an address terminal, and refresh is achieved by selecting all refresh addresses. The RAS-only refresh procedure is a common refresh technique for systems using dynamic RAMs.

The RAS signal serves to latch a row address supplied from the outside to select the row of a memory cell of a dynamic RAM in an internal row address decoder.

The CAS signal serves to latch a column address supplied from the outside to select the column of a memory cell of a dynamic RAM in an internal column address decoder.

With reference to the accompanying drawings, the read/write operation of a dynamic RAM and the RAS-only refresh procedure will be described.

As illustrated in FIG. 1, a central processing unit (hereinafter referred to as a CPU) 401 reads data from and writes data into a dynamic RAM array 411. Although a system logic control unit is typically considered part of the CPU, the system logic will be referred to separately to facilitate an understanding of the read/write and refresh procedures for the dynamic RAM. The CPU 401 provides a read or write address to a CPU address bus 405 and further provides a CPU status signal 403 to instruct a system logic 406 to read/write the data from/into the dynamic RAM array 411.

The system logic 406 transmits the address provided from the CPU address bus 405 onto a memory address bus 407 as a row address and a column address of the dynamic RAM.

The system logic 406 further switches the RAS signal 408 from a "H" level to a "L" level while providing the row address, thereby latching that signal in the dynamic RAM array 411 as the row address of the dynamic RAM.

Thereafter, the system logic 406 switches the CAS signal 409 from a "H" level to a "L" level while providing the column address, thereby latching that signal in the dynamic RAM array 411 as the column address of the dynamic RAM.

At that time, if the CPU status signal 403 from the CPU 401 is an instruction to write associated data into the dynamic RAM, a WE (Write Enable) signal 410 is switched from "H" to "L" level, thereby transferring the write data on the CPU data bus 402, provided from the CPU 401, into the dynamic RAM array 411.

In contrast, if the CPU status signal 403 from the CPU 401 is an instruction to read associated data from the dynamic RAM, then after a short delay, data from the dynamic RAM array 411 is outputted on the CPU data bus 402 and is received by the CPU 401. The system logic 406 coordinates the timing of the receiving of the read data by the CPU 401 via a ready signal 404.

The foregoing is a description of the read/write operation by the CPU 401 from/into the dynamic RAM array 411.

The system logic 406 must refresh the dynamic RAM array 411 within a predetermined time interval while the CPU 401 reads/writes associated data from/into the dynamic RAM array 411.

The system logic 406 includes therein a circuit for generating raw addresses, which serves to interrupt the CPU 401 during each predetermined time interval by providing a row address for output to the memory address bus 407 while the RAS signal 408 is switched from the "H" level to the "L" level, maintaining the CAS signal 409 at the "H" level.

The aforementioned refreshing technique is called a RAS-only refresh. Referring to FIG. 2, there is illustrated a timing relationship between the RAS signal 408 and the row address in the RAS-only refresh.

As illustrated in FIG. 2, prior to the RAS signal 408 being switched from the "H" level to the "L" level, a row address has previously been stabilized on the memory address bus 407, and when the RAS signal 408 is switched from the "H" level to "L" level, the row address is latched in the dynamic RAM array 411.

Thereafter, the data stored in the dynamic RAM at the designated row addresses are read out therefrom, and are again stored at their original addresses when the RAS signal is switched from the "L" to "H" level.

Such a RAS-only refresh technique described above with reference to FIGS. 1 and 2 is relatively simplified in its control, and hence is useful in many personal computers (those from IBM and compatible ones therewith). Accordingly, manufacturers of the system logic 406 of FIG. 1, which controls the refreshing of a dynamic RAM, all adopt the RAS-only refresh technique. This is inevitably required for ensuring compatibility of associated systems.

RAS-only refreshing, however, suffers from problems such as having a large consumed current when data holding (suspending) by the dynamic RAM array is performed, even while restricting to the minimum the total of consumed currents other than that in the dynamic RAM array. The system logic, which controls the refresh addressing, needs to generate a refresh address even during the suspension and hence requires ordinary operation. This results in the large consumed current during the suspension.

Most portable personal computers include systems driven by a battery and often enjoy the use of a large capacity dynamic RAM as a main memory. Such systems driven by a battery, however, have difficulty in that their battery charge life is severely reduced because of the consumed current necessary for the RAS-only refresh.

There is known for dynamic RAMs CAS-before-RAS refreshing which is accomplished with a relatively less consumed current. Referring to FIG. 3, there will be described the CAS-before-RAS refresh.

The CAS-before-RAS refresh is such that a CAS signal is switched from a "H" level to a "L" level before a RAS signal is switched from a "H" level to a "L" level, and the operation enters a CAS-before-RAS refresh cycle provided the CAS signal remains at the "L" level even after the RAS signal is altered from the "H" to "L" level.

The CAS-before-RAS refresh technique does not need a refresh address to be supplied from the system logic, as does the RAS-only refresh. Instead, a row of the dynamic RAM is designated by a refresh address generated by a counter included in the dynamic RAM.

The CAS-before.-RAS refresh is further advantageous in that it is easily changed to the self-refresh operation. The self-refresh enjoys the least consumed current and is suitable for data holding by a dynamic RAM.

Referring to FIG. 4, there will be described the self-refresh.

As understood from FIG. 4, the self-refresh operation toggles the RAS signal between the "H" level and the "L" level while the CAS signal remains at the "L" level. This results in the least consumed current during data holding by the dynamic RAM.

It is further possible to transfer the operation with ease from the CAS-before-RAS refresh to the self-refresh, and vice versa.

In operation, an actual measurement of the mean consumed current upon refreshing reads 80 mA for the RAS-only refresh, 60 mA for the CAS-before-RAS refresh, and 30 mA for the self-refresh.

In prior art systems, many personal computers which support only the RAS-only refresh are obliged to use the RAS-only refresh technique, which is burdened with the greatest consumed current during data holding by the dynamic RAM.

When the RAS-only refresh is used, transferring to self-refresh for data holding by the dynamic RAM is very difficult. The reason for this is that a refresh address during the RAS-only refresh is supplied externally of the dynamic RAM array 411, as illustrated in FIG. 1, while a refresh address during the self-refresh is supplied from a counter included in the dynamic RAM array 411. This causes a discontinuous change in refresh addresses upon the operation being switched from the RAS-only refresh to the self-refresh.

The present invention has been made in view of the foregoing circumstances, and has for its object to provide a refresh switching circuit of a dynamic RAM wherein the prior art RAS-only refresh is switched to the CAS-before-RAS refresh, which consumes less current, and the dynamic RAM is then easily transferred to self-refresh for data holding (suspension). Furthermore, the refresh switching circuit is compatible with prior art personal computer systems in regard to both hardware and software.

SUMMARY OF THE INVENTION

To achieve the above objects of the present invention, there is provided a dynamic RAM in a microprocessor system comprising a central processing unit, a dynamic RAM array, and a system logic, which is characterized by including a refresh switching circuit for switching RAS-only refresh to CAS-before-RAS refresh when RAS-only refresh is executed for the dynamic RAM array.

In the dynamic RAM set forth above, the refresh switching circuit can also perform a switching operation between the CAS-before-RAS refresh and a self-refresh, thereby suspending the data held by the dynamic RAM with less power consumption.

Further, in the dynamic RAM set forth above, the refresh switching circuit comprises an external terminal for inputting a clock signal with a cycle time within the allowable range of data holding times for the dynamic RAM array, thereby enabling the dynamic RAM to perform the refresh operation even when both the central processing unit and the system logic are stopped.

The above and many other advantages, features, and additional objects of the present invention will become manifest to those versed in the art upon making reference to the following detailed description and accompanying drawings in which preferred embodiments incorporating the principles of the present invention are shown by way of illustrative example.

DESCRIPTION OF THE PREFERRED EMBODIMENTS

A preferred embodiment of the present invention will be described with reference to FIGS. 5 to 9.

As illustrated in FIG, 5, the dynamic RAM of the present invention comprises a CPU 101, a system logic 110 for controlling a dynamic RAM array 115 on the basis of an instruction from the CPU 101, and a refresh switching circuit 111 for switching RAS-only refresh issued from the system logic 110 to the dynamic RAM array 115 to CAS-before-RAS refresh.

Figure 1:
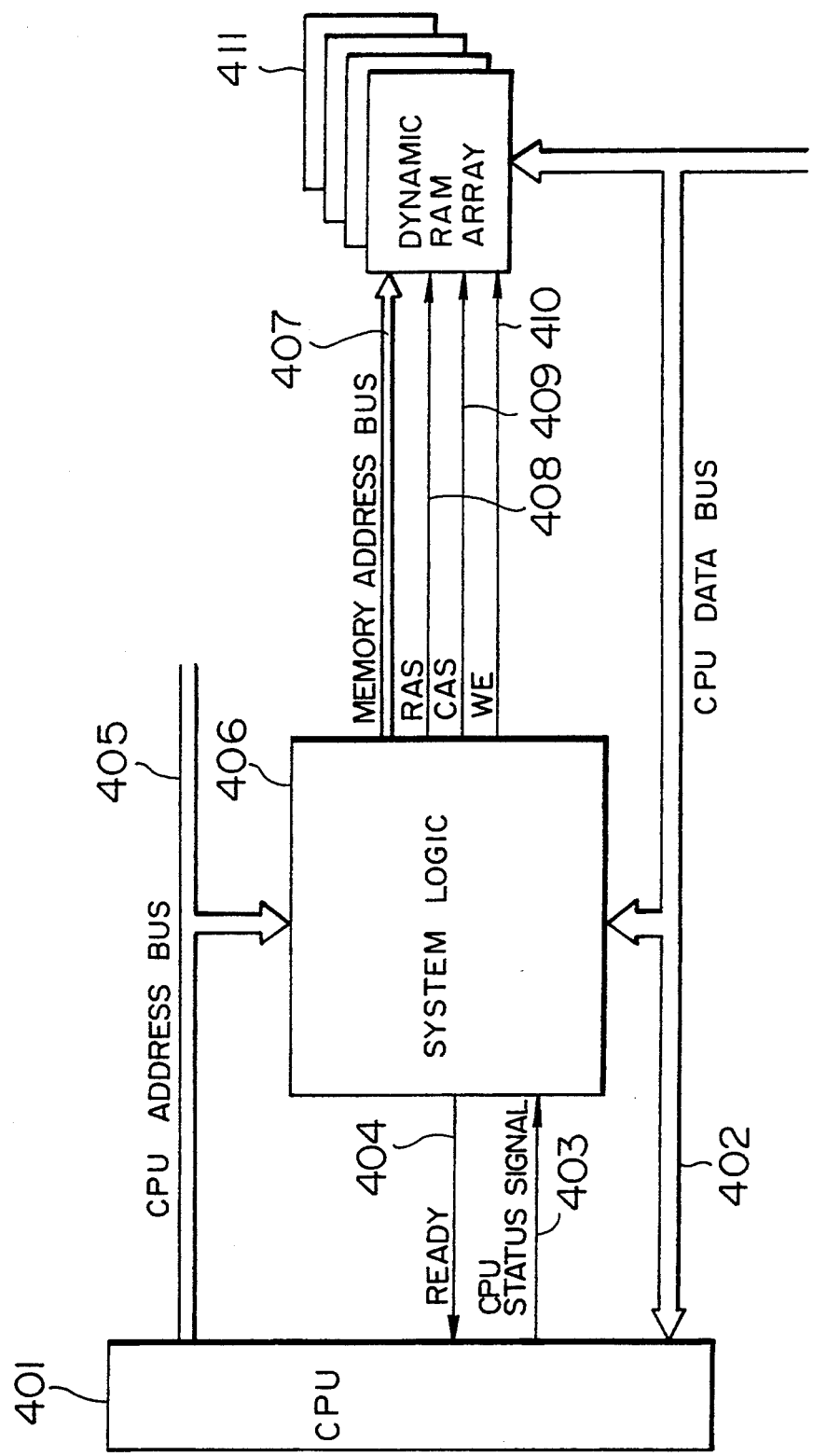
FIG. 1 is a circuit diagram illustrating the arrangement of a prior art dynamic RAM.
Figure 2:
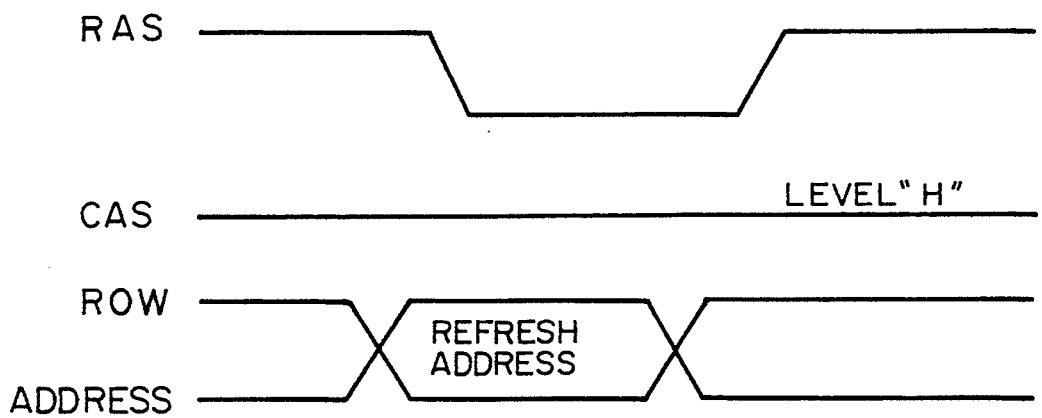
FIG. 2 is a timing chart illustrating RAS-only refresh.
Figure 3:
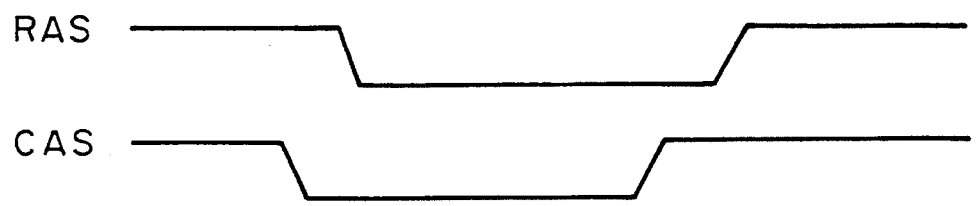
FIG. 3 is a timing chart illustrating CAS-before-RAS refresh.
Figure 4:
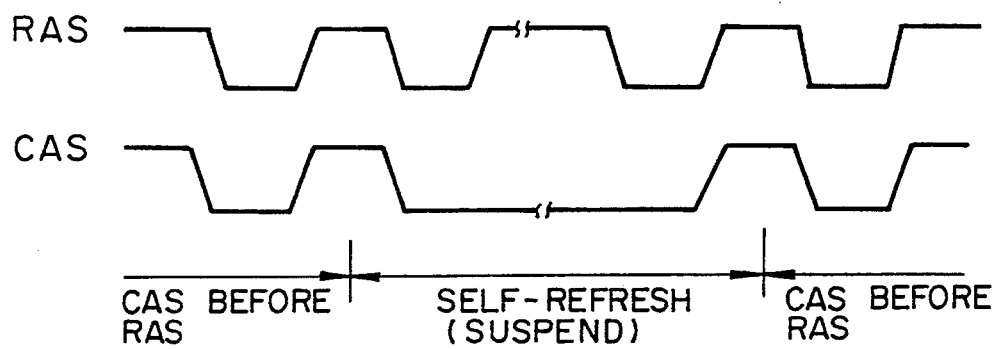
FIG. 4 is a timing chart illustrating the operation of the prior art when the operation is switched from CAS-before-RAS refresh to self-refresh and then returned to CAS-before-RAS refresh.
Figure 5:
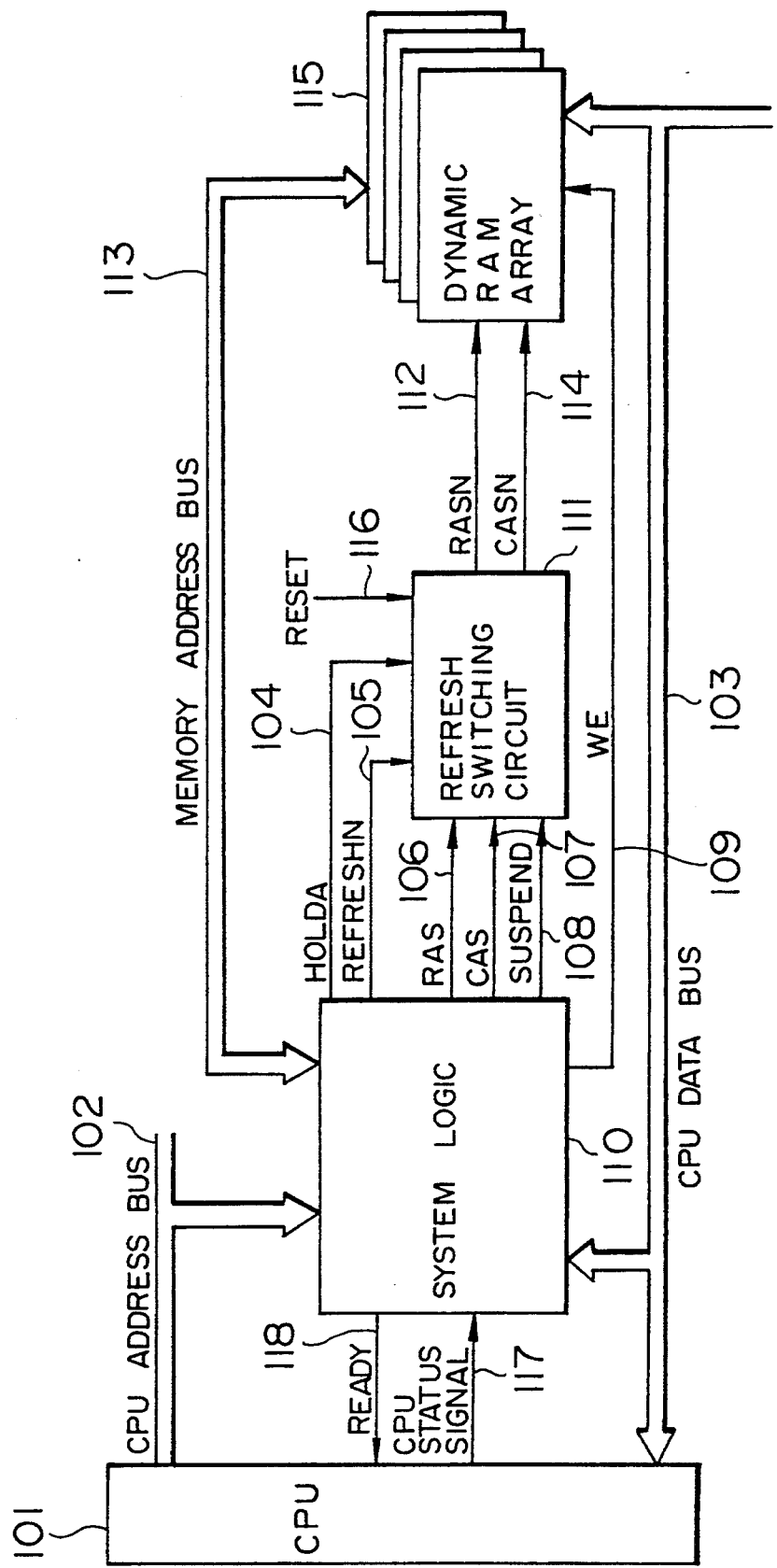
FIG. 5 is a circuit diagram illustrating the arrangement of a dynamic RAM with a refresh switching circuit.

When the CPU 101 of FIG. 5 desires to access the dynamic RAM array 115 to read/write data from/into the same, the CPU 101 transmits a read/write address onto a CPU address bus 102, end provides a read/write instruction to the system logic 110 through a CPU status signal 117.

The system logic 110 separates the address transmitted through the CPU address bus 102 into a row address and a column address for the dynamic RAM array 115 and transfers those addresses onto a memory address bus 113.

The system logic 110 further switches a RAS signal 106 from the "H" level to the "L" level while transmitting the row address.

The refresh switching circuit 111, as receiving the RAS signal 106 changing from the "H" to "L" level, switches a RASN signal 112, altered to the CAS-before-RAS refresh format, from the "H" to "L" level, thereby latching the transmitted row address into the dynamic RAM array 115.

Thereafter, the output from the system logic 110 is altered from the row address to the column address, and a CAS signal 107 is changed from the "H" level to the "L" level.

The refresh switching circuit 111, as receiving the CAS signal 107 changing from the "H" level to the "L" level, switches a CASN signal 114, altered to the CAS-before-RAS refresh format, from a "H" level to a "L" level, thereby latching the transmitted column address into the dynamic RAM array as the column address of the dynamic RAM.

If the CPU status signal 117 from the CPU 101 is an instruction to write data into the dynamic RAM array 115, a WE (Write Enable) signal 109 is changed from a "H" level to a "L" level, thereby writing the data on the CPU data bus 103, provided from the CPU 101, into the dynamic RAM array 115.

If the CPU star,us signal 117 from the CPU 101 is an instruction to read data from the dynamic RAM array 115, then read data residing in the dynamic RAM, the location of which having been specified by the row and column addresses provided by the system logic 110, is transmitted onto the CPU data bus 103 and is received by the CPU 101 as read data. In the case where the data read out from the dynamic RAM array 115 is outputted with a delay, the system logic 110 coordinates the timing of the CPU 101 incorporating the read data from the CPU data bus 103 by way of a READY signal 118.

The foregoing is a description of the read/write operation of the CPU 101 from/into the dynamic RAM array 115.

In accordance with the present invention, the RAS-only refresh in the prior art personal computers is switched to the CAS-before-RAS refresh through the refresh switching circuit, thereby allowing the operation to be further transferred with ease to self-refresh (suspension) by the dynamic RAM while maintaining compatibility with the prior art personal computer systems in regard to both hardware and software.

Hereinafter, a circuit arrangement of the refresh switching circuit illustrated in FIG. 5 will be described with reference to a circuit diagram illustrated in FIG. 8.

Figure 8:
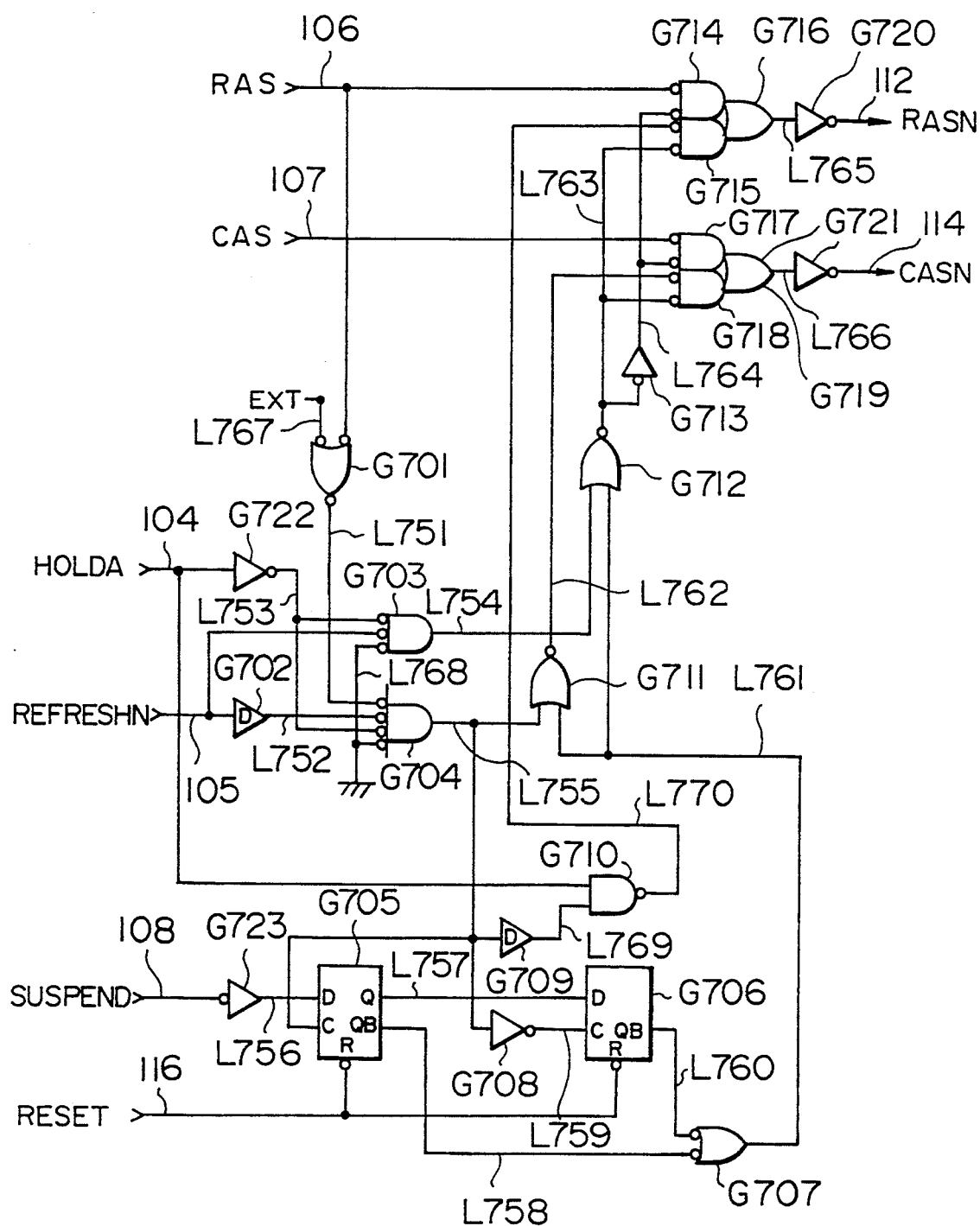
FIG. 8 is a circuit diagram illustrating the refresh switching circuit of the present invention.

As illustrated in FIG. 8, the RAS signal 106 is fed to respective input terminals of a gate G701 and a composite gate G714. The other input terminal of the gate G701 is fed from an external terminal (EXT) with a signal on signal line L767 which acts in a manner similar to the RAS signal 106 during the self-refresh. The other input terminal of the composite gate G714 is connected to the output signal line L764 from an inverter G713.

The CAS signal is fed to an input terminal of a composite gate G717. The other input terminal of the composite gate G717 is fed by the output signal on the output signal line L764 from the inverter G713.

A HOLDA signal 104, indicative of permission to refresh, is entered to, the input terminal of an inverter G722 and to an input terminal of a gate G710.

A REFRESHN signal 105, indicative of the operation being in refresh mode, is entered to an input terminal of a gate G703 and to the input terminal of a delay element G702.

An output signal on a signal line L753 from the inverter G722 is entered to an input terminal of the gate G703 and to an input terminal of a gate G704.

Further, an output signal from the gate G701 is entered to an input terminal of the gate G704.

An output signal on a signal line L752 from the delay element G702 is entered to an input terminal of the gate G704.

A signal line L768 connected between input terminals of the gate G703 and the gate G704 is connected to ground potential.

Further, an output signal line L754 of the gate G703 is connected to an input terminal of a gate G712.

An output signal line L755 of the gate G704 is connected to an input terminal of a gate G711, to the input terminal of a delay element G709, to the clock terminal of a flip-flop G705, and to the input terminal of an inverter G708.

A data holding SUSPEND signal line 108 is connected to the input terminal of an inverter G723.

A RESET signal line 116 is connected to the reset terminal of the flip-flop G705 and to the reset terminal of a flip-flop G706.

An output signal line L756 of the inverter G723 is connected to the data terminal of the flip-flop G705.

A Q output signal line L757 of the flip-flop G705 is connected to the data terminal of the flip-flop G706.

A QB output signal line L758 of the flip-flop G705 is connected to an input terminal of a gate G707.

A QB output signal line L760 of the flip-flop G706 is connected to an input terminal of the gate G707.

An output signal line L759 of the inverter G708 is connected to the clock terminal of the flip-flop G706.

An output signal line L769 of the delay element G709 is connected to an input terminal of a gate G710.

An output signal line L761 of the gate G707 is connected to an input terminal of the gate G711 and the gate G712.

An output signal line L770 of the gate G710 is connected to an input terminal of a composite gate G715.

An output signal line L762 of the gate G711 is connected to an input terminal of a composite gate G718.

An output signal line L763 of the gate G712 is connected to an input terminal of the composite gate G718, to an input terminal of the composite gate G715, and to the input terminal of the inverter G713.

An output terminal of the composite gate G714 and an output terminal of the composite gate G715 are part of a composite gate construction and are directly connected to the input terminals of a composite gate G716.

An output signal line L765 of the composite gate G716 is connected to the input terminal of an inverter G720, the output terminal of which provides a RASN signal 112.

An output terminal of the composite gate G717 and an output terminal of the composite gate G718 are part of a composite gate construction and are directly connected to the input terminals of a composite gate G719.

An output signal line L766 of the composite gate G719 is connected to the input terminal of an inverter G721, the output terminal of which provides a CASN signal 114.

The gate G701 comprises a 2-input AND gate and the gates G711 and G712 comprise 2-input NOR gates. The gate G710 and the gate G707 comprise 2-input NAND gates, and the gate G703 comprises a 3-input NOR gate. The gate G704 comprises a 4-input NOR gate, and the flip-flops G705 and G706 comprise D flip-flops.

Further, the composite gates G714 and G715 comprise 2-input NOR gates, and the composite gate G716 comprises a 2-input OR gate. The composite gates G717 and G718 comprise 2-input NOR gates, and the composite gate G719 comprises a 2-input OR gate.

The delay elements G702 and G709 comprise integration circuits and serve to delay their respective input signals.

The inverter G720 and the inverter G721 serve to drive the dynamic RAM array 115 illustrated in FIG. 5.

There will now be described a circuit operation for the refresh switching circuit illustrated in FIG. 8.

As shown in FIGS. 8, the signal line L764 is of the "L" level except during the refresh mode, so that the RAS signal 106 and the CAS signal 107 satisfy gate conditions of the composite gate G714 and of the composite gate G717, respectively, when latching row and column addresses into the dynamic RAM array. Accordingly, a signal on the output signal line L765 of the composite gate G716 is inputted to the inverter G720, and the RASN signal 112 is provided on the output terminal of the inverter G720 to drive the dynamic RAM array 115 illustrated in FIG. 5. Similarly, the signal on the output signal line L766 of the composite gate G719 is inputted to the inverter G721, and the CASN signal 114 is provided on the output terminal of the inverter G721 to drive the dynamic RAM array 115.

The refresh switching circuit 111 illustrated in FIG. 5 is therefore operated as in the prior art example during the read/write operation of the CPU 101 from/into the dynamic RAM array 115.

The system logic 110 instructs the dynamic RAM array 115 to execute the RAS-only refresh after the lapse of a predetermined time. At that time, the refresh switching circuit 111 may switch the operation from the RAS-only refresh to the CAS-before-RAS refresh to refresh the dynamic RAM array 115.

Next, the circuit operation of the refresh switching circuit 111 will be described with reference to the waveform diagrams shown in FIGS. 6 and 7.

Figure 6:
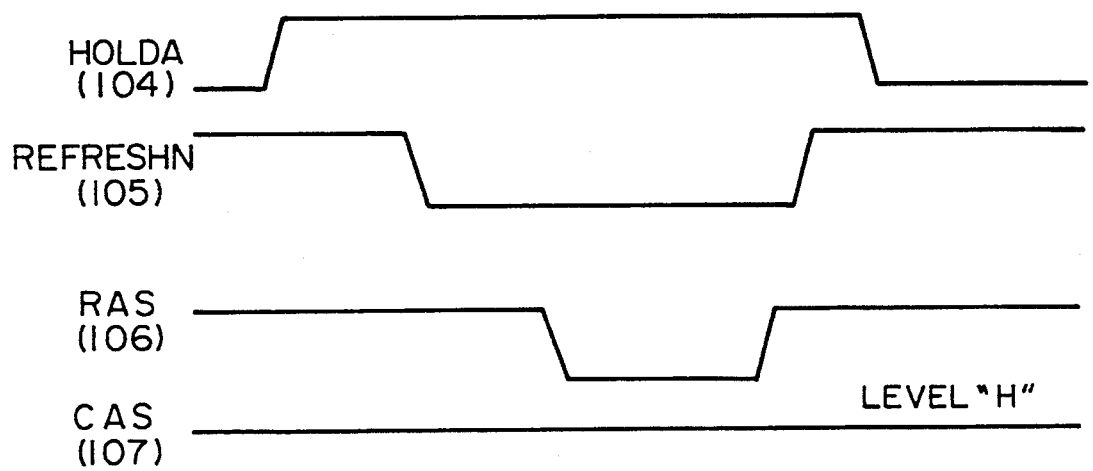
FIG. 6 is a timing chart illustrating RAS-only refresh issued by a system logic to a refresh switching circuit.

Referring to FIG. 6, there is illustrated a timing relationship among the HOLDA signal 104, indicative of permission by the system logic 110 to refresh, the REFRESHN signal 105, indicative of the system logic 110 being in the refresh mode, the RAS signal 106, and the CAS signal 107. The refresh switching circuit 111 executes the RAS-only refresh in this timing.

Figure 7:
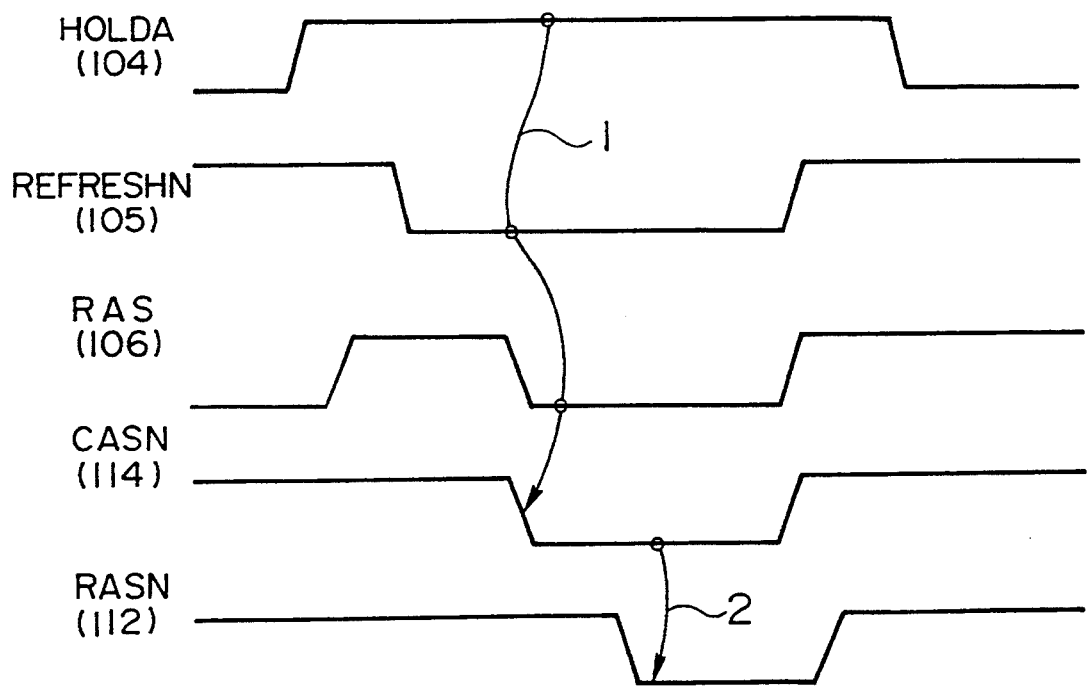
FIG. 7 is a timing chart illustrating a conversion from RAS-only refresh to CAS-before-RAS refresh by the refresh switching circuit.

Referring to FIG. 7, there is illustrated a timing chart which indicates a process where the RAS-only refresh is switched to the CAS-before-RAS refresh.

There will next be described a switching operation indicated by the arrow 1 in FIG. 7 and with further reference to FIG. 8.

As shown in FIG. 8, when the HOLDA signal 104 stays at the "H" level, the REFRESHN signal 105 stays at the "L" level, and the RAS signal 106 is changed from the "H" level to the "L" level, the output signal on the output signal line L754 of the gate G703 is changed to the "H" level and the output signal on the output signal line L763 of the gate G712 is changed to the "L" level.

Thereafter, the output signal on the output signal line L755 of the gate G704 becomes the "H" level and the output signal on the output signal line L762 of the gate G711 becomes the "L" level. At that time, logical conditions of the composite gate G718 are satisfied, and therefore the CASN signal 114 becomes the "L" level.

The reason why the delay element G702 is inserted between the REFRESHN signal 105 input and an input to gate G704 is that there exists such a time when the HOLDA signal 104 is at the "H" level, the REFRESHN signal 105 is at the "H" level, and the RAS signal 106 is at the "L" level. In order to to discriminate the RAS signal 106 at this time from the RAS signal 106 during a refresh, the REFRESHN signal 105 is delayed through the delay element G702.

The just-mentioned timing, in which the HOLDA signal 104 is at the "H" level, the REFRESHN signal 105 is at the "H" level, and the RAS signal 106 is at the "L" level, is produced just before the operation enters the refresh mode.

Next, there will be described a switching operation indicated by the arrow 2 in FIG. 7 with further reference to FIG. 8.

The output signal on the output signal line L755 of the gate G704 is delayed through the delay element G709, after which the output signal on the output signal line L770 of the gate G710 becomes the "L" level to satisfy the logical condition of the composite gate G715 to permit the RASN signal 112 to become the "L" level.

The RASN signal 112 becomes the "L" level later than the CASN signal 114 as a result of the delay element G709.

Similarly, the RASN signal 112 becomes the "H" level later than the CASN signal 114, again as a result of the delay element G709, and at this time, the switching of the RAS-only refresh to the CAS-before-RAS refresh is completed.

By this operation, the dynamic RAM array 115 is refreshed by the RASN signal 112 and the CASN signal 114 as a result of the RAS signal 106 being changed to the CAS-before-RAS refresh.

The CAS-before-RAS refresh is such that the CASN signal 114 is switched from the "H" level to the "L" level before the RASN signal 112 is switched, and the dynamic RAM enters the CAS-before-RAS refresh cycle provided the CASN signal 114 stays at the "L" level even after the RASN signal 112 is switched from the "H" level to the 37 L" level.

The above-described CAS-before-RAS refresh technique does not require a refresh address to be provided by the system logic 110 to the memory address bus 113, but instead allows for a designated row to be refreshed on the basis of a refresh address generated by the counter in the dynamic RAM.

Next, there will be described a process for switching from the CAS.-before-RAS refresh to the self-refresh (suspension) by the dynamic RAM, and then returning to the CAS-before-RAS refresh. Reference is made to the arrow 3 in FIG. 9 and to FIG. 8.

Such a refresh switching circuit, capable of switching from CAS-before-RAS to self-refresh and vice versa, is comprised of the circuit shown in FIG. 8 from which the gates G714 and G717 are omitted and in which the RAS signal 106 and the output of gate G715 are fed into the inputs of gate G716, and in which the output of gate G718 is fed into an input of the gate G719.

In this refresh switching circuit for implementing self-refresh, when the SUSPEND signal 108 becomes the "L" level, the output signal on the output signal line L761 from the gate G707 becomes the "H" level with the rising of the output signal on the output signal line L755 from the gate G704, thereby satisfying the logical condition of the composite gate G718 and permitting the CASN signal 114 to become the "L" level.

The self-refresh is started in this manner, the dynamic RAM being refreshed each time the RASN signal 112 is cycled with the CASN signal 114 at the "L" level.

In the self-refresh mode, when there is no input of the RAS signal 106, namely, when both the CPU 101 and the system logic 110 are inactive, a clock signal is fed from the external terminal (EXT) into an input terminal of the gate G701. Accordingly, it becomes possible to hold data in the dynamic RAM array 115 with a remarkably lower consumed electric power, provided that the clock input has a cycle time within the allowable range of data holding times in the dynamic RAM array 115.

Figure 9:
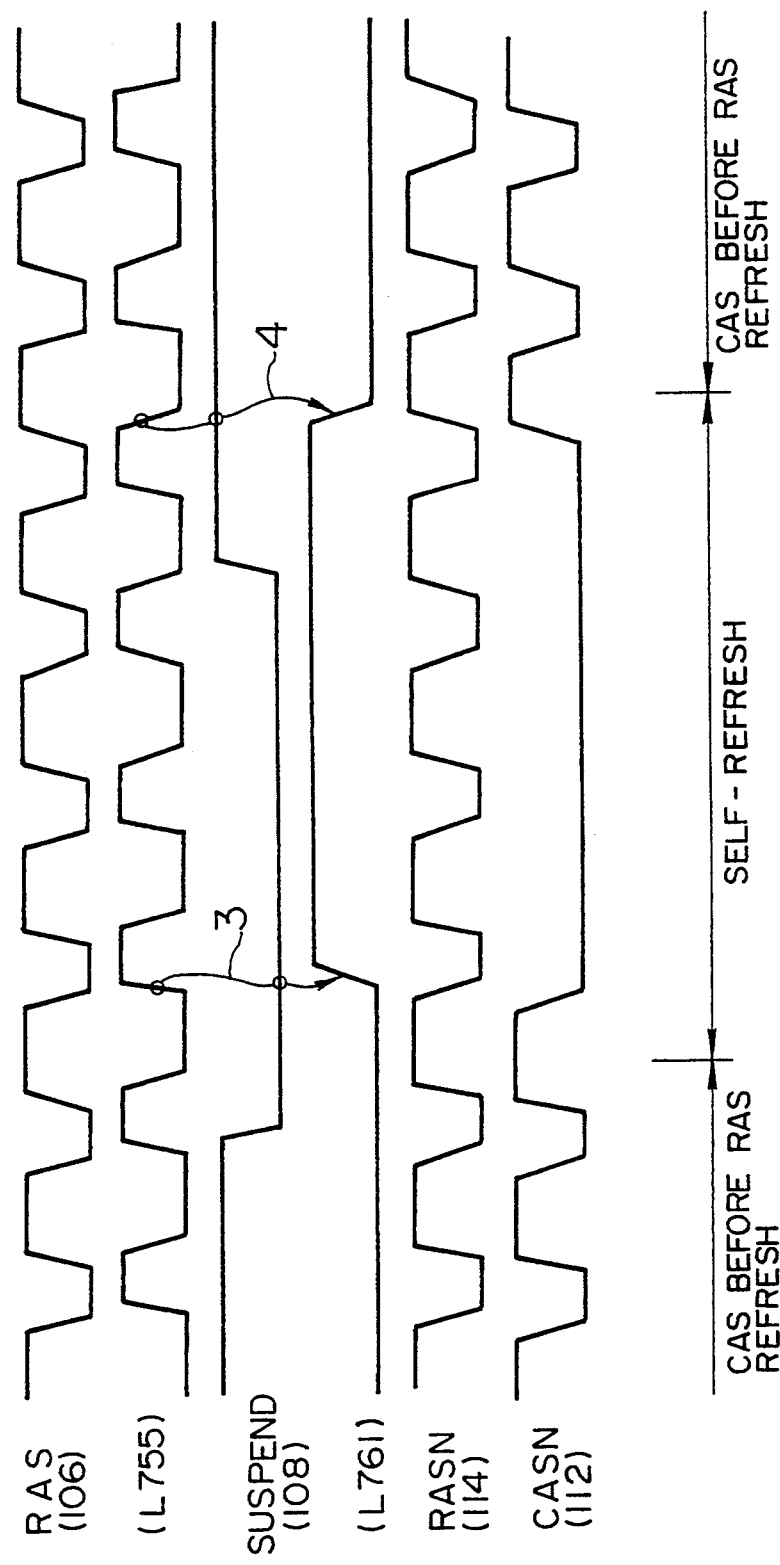
FIG. 9 is a timing chart illustrating a conversion from CAS-before-RAS refresh to self-refresh and then back to CAS-before-RAS refresh.

Reference is now made to the switching operation indicated by the arrow 4 in FIG. 9 with further reference to FIG. 8.

When the SUSPEND signal 108 is switched to the "H" level, the output signal on the output signal line L761 of the gate G707 becomes the "L" level at the falling of the output signal on the output signal line L755 of the gate G704, thereby switching the CASN signal 114 to the "H" level. At this time, the self-refresh is complete and the operation returns to the CAS-before-RAS refresh.

In the above-described switching circuit, switching between the CAS-before-RAS refresh and the self-refresh is easily achieved, thereby implementing data holding (suspension) by the dynamic RAM with a lower consumed electric power.

It should be noted that the RESET signal 116 is switched to the "L" level at a time when the system power supply is on so as to initialize the electronic circuits such as the flip-flops.

Industrial Utility

As apparent from the above description of the present invention, a personal computer incorporating the dynamic RAM of the present invention will enjoy a greatly reduced consumption of current through the personal computer when data holding by the dynamic RAM is performed.

Additionally, the dynamic RAM refresh circuit is compatible with the prior art personal computers in regard to both hardware and software.

What is claimed is:

1. A dynamic RAM in a microprocessor system including a central processing unit, a dynamic RAM array and a system logic, said dynamic RAM comprising a refresh switching circuit having means for converting RAS-only refresh to CAS-before-RAS refresh in response to RAS and CAS signals when the RAS-only refresh is executed for the dynamic RAM array.

2. The dynamic RAM according to claim 1, wherein said refresh switching circuit has means for performing a switching operation between said CAS-before-RAS refresh to achieve a self-refresh, thereby providing a data holding by said dynamic RAM with a lower consumed electric power.

3. The dynamic RAM according to claim 2, further comprising an external terminal for inputting therein a clock signal having a periodic time within the allowable range of data holding times in said dynamic RAM array, thereby enabling said dynamic RAM to perform the refresh operation even when both said central processing unit and said system logic are stopped.

4. The dynamic RAM according to claim 1, further comprising an external terminal for inputting therein a clock signal having a periodic time within the allowable range of data holding times in said dynamic RAM array, thereby enabling said dynamic RAM to perform the refresh operation even when both said central processing unit and said system logic are stopped.

5. A refresh switching circuit for a microprocessor system having a central processing unit, a system logic, and a dynamic RAM array, said circuit having means for converting a RAS-only refresh command from said system to a CAS-before-RAS refresh, thereby reducing power consumed by said system during a refresh operation.

6. The switching circuit of claim 5 wherein said circuit has means for passing a RAS signal there through unchanged when said system is not performing a refresh operation.

7. The switching circuit of claim 6 wherein said switching circuit includes an external terminal for inputting a clock signal, thereby permitting said system to perform a refresh operation when said central processing unit and said system logic are inactive.

8. The switching circuit of claim 5 wherein said switching circuit includes an external terminal for inputting a clock signal, thereby permitting said system to perform a refresh operation when said central processing unit and said system logic are inactive.

9. The switching circuit of claim 5 wherein said switching means includes means for converting said CAS-before-RAS refresh to a self-refresh, thereby further reducing the power consumed by said system during a refresh operation.

10. The switching circuit of claim 9 wherein said circuit has means for passing a RAS signal there through unchanged when said system is not performing a refresh operation.

11. The switching circuit of claim 10 wherein said switching circuit includes an external terminal for inputting a clock signal, thereby permitting said system to perform a refresh operation when said central processing unit and said system logic are inactive.

12. The switching circuit of claim 9 wherein said switching circuit includes an external terminal for inputting a clock signal, thereby permitting said system to perform a refresh operation when said central processing unit and said system logic are inactive.

13. A method for refresh switching in a microprocessor system, said system having a central processing unit, a system logic, a dynamic RAM array, and a refresh switching circuit, the method comprising the steps of:
inputting a RAS signal to said switching circuit; and
converting said RAS signal to CAS-before-RAS refresh signals when said system is in a refresh operation.

14. The method of claim 13 further comprising the step of outputting said RAS signal from said circuit unchanged when said system is not in a refresh operation.

15. The method of claim 14 wherein said circuit includes an external terminal, and the method further comprises the step of inputting a clock signal into said external terminal to thereby permit said system to perform a refresh operation when said CPU and said system logic are inactive.

16. The method of claim 13 wherein said circuit includes an external terminal, and the method further comprises the step of inputting a clock signal into said external terminal to thereby permit said system to perform a refresh operation when said CPU and said system logic are inactive.

17. The method of claim 13 further comprising the step of converting said CAS-before-RAS refresh signals to self-refresh signals when said system is in a refresh operation.

18. The method of claim 17 further comprising the step of outputting said RAS signal from said circuit unchanged when said system is not in a refresh operation.

19. The method of claim 18 wherein said circuit includes an external terminal, further comprising the step of inputting a clock signal into said external terminal to thereby permit said system to perform a refresh operation when said CPU and said system logic are inactive.

20. The method of claim 17 wherein said circuit includes an external terminal, and the method further comprises the step of inputting a clock signal into said external terminal to thereby permit said system to perform a refresh operation when said CPU and said system logic are inactive.

* * * * *